United States Patent [19]
Contrata et al.

[11] Patent Number: 5,943,577
[45] Date of Patent: Aug. 24, 1999

[54] METHOD OF MAKING HETEROJUNCTION BIPOLAR STRUCTURE HAVING AIR AND IMPLANTED ISOLATIONS

[75] Inventors: Walter Contrata; Naotaka Iwata, both of Tokyo, Japan

[73] Assignee: NEC Corporation, Tokyo, Japan

[21] Appl. No.: 08/982,309

[22] Filed: Dec. 1, 1997

[30] Foreign Application Priority Data

Dec. 2, 1996 [JP] Japan .................................. 8-321807

[51] Int. Cl.$^6$ ................................................. H01L 21/331
[52] U.S. Cl. ........................ 438/319; 438/315; 438/411; 438/412; 438/421; 438/423; 148/DIG. 72; 257/200
[58] Field of Search ................................. 438/411, 412, 438/421–423, 312, 315–319, FOR 225, FOR 226, FOR 286, FOR 179; 148/DIG. 72; 257/197, 200

[56] References Cited

U.S. PATENT DOCUMENTS

| | | | |
|---|---|---|---|
| 4,751,195 | 6/1988 | Kawai ........................................ | 437/31 |
| 4,983,532 | 1/1991 | Mitani et al. ............................. | 437/31 |
| 5,124,270 | 6/1992 | Morizuka ....................... | 148/DIG. 72 |
| 5,166,083 | 11/1992 | Bayraktaroglu ................. | 148/DIG. 72 |
| 5,284,783 | 2/1994 | Ishikawa et al. ......................... | 437/31 |
| 5,512,496 | 4/1996 | Chau et al. ............................... | 437/31 |

OTHER PUBLICATIONS

Mau–Chung F. Chang et al., IEEE Electron Device Letters, vol. EDL.8, AlGaAs/GaAs Heterojunction Bipolar Transistors Fabricated Using a Self–Aligned Dual–Lift–Off Process, Jul. 7, 1987, pp. 303–305.

*Primary Examiner*—Peter Toby Brown
*Assistant Examiner*—Long Pham
*Attorney, Agent, or Firm*—Young & Thompson

[57] ABSTRACT

In a method manufacturing a semiconductor device, a semiconductor layer having a device forming region is formed on substrate. Next, a region except for the device forming region is changed into an insulator. In this case, a conducting path is left across the semiconductor device to electrically connect the semiconductor device with an adjacent semiconductor device. Subsequently, the device forming region is etched on the condition that the conducting path is left. Finally, the conducting path is disrupted after the etching process. Thus, the semiconductor device and the adjacent semiconductor device are left in an electrical contact via the conducting path during the etching process. Consequently, the uniformity of the etching between the semiconductor devices is largely improved.

21 Claims, 23 Drawing Sheets

METHOD OF MAKING HETEROJUNCTION BIPOLAR STRUCTURE HAVING AIR AND IMPLANTED ISOLATIONS

BACKGROUND OF THE INVENTION

This invention relates to a method of manufacturing a compound semiconductor devices such as a heterojunction bipolar transistor (HBT), a hot electron transistor (HET), a field effect transistor (FET) and an integrated circuit (IC) including these devices.

In manufacturing a compound semiconductor device like an HBT or FET, it is often necessary to prevent undesirable electrical contacts between neighboring devices by a process known as device-to device isolation. This is commonly achieved through etching of the conducting material in the regions between devices or through ion implantation to convert those regions to an insulating state. After device-to-device isolation, each device is surrounded by insulating material like an island. It is also necessary to fabricate electrical connections between the electrodes (e.g. the emitter, base, and collector electrodes of an HBT) of the devices to form functional circuits, as by electroplating or by bonding wires. In order to facilitate alignment of these electrical connections to the electrodes, which can be of very small dimensions, contact pads are typically fabricated contiguous to and at the same time as the electrodes. With these pads, an undesirable, parasitic capacitance is associated. This parasitic capacitance is generally minimized by fabricating the pads on the insulating regions between devices. Therefore, a typical device fabrication sequence consists of first device-to-device isolation, next electrode formation, including etching to expose various device layers (e.g. base exposure etch or FET gate recess etch), and finally inter-electrode connection formation. However, although these exposure etches must be precisely controlled for optimal device performance, it is widely understood that etching uniformity decreases when performed on isolated devices, particularly when the regions to be etched have various sizes. This problem is sometimes solved in the case of common source FET applications by using a partial isolation process which isolates all drain areas, but leaves the source areas in electrical contact.

According to the conventional isolation method, there is a trade-off between parasitic capacitance and etching uniformity. The etching uniformity may be increased at the expense of increased parasitic capacitance, or the parasitic capacitance may be reduced.

In addition, the etching uniformity may be realized in the conventional partial isolation method. However, the application of this method is restricted to specific circuits, since all devices are in an electric contact after the fabrication. For example, the application of the method is mainly restricted to the common source FET circuit in the fabrication of the FET.

SUMMARY OF THE INVENTION

It is therefore an object of this invention to provide a method of manufacturing a semiconductor device which is capable of uniformly etching a semiconductor layer regardless of an ultimate circuit configuration.

According to this invention, a semiconductor layer having a device forming region is formed on a substrate. Next, a region except for the device forming region is changed into an insulator. In this case, a conducting path is left across the semiconductor device to electrically connect the semiconductor device with an adjacent semiconductor device. Subsequently, the device forming region is etched on the condition that the conducting path remains. Finally, the conducting path is disrupted after the etching.

Thus, the semiconductor device and the adjacent semiconductor device remain in electrical contact via the conducting path during the etching process. Consequently, the uniformity of the etching between the semiconductor devices is largely improved. Further, the complete isolation between the semiconductor devices is carried out by disrupting the conducting path after the etching process.

DESCRIPTION OF THE PREFERRED EMBODIMENTS

Referring to FIG. 1, an outline of this invention will be first described below.

Figure 1A:
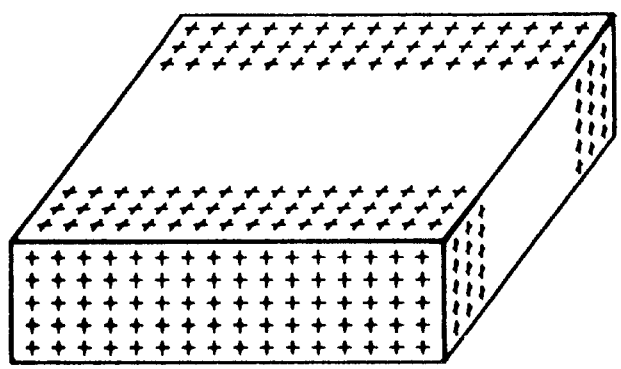
FIGS. 1A and 1B are schematic views showing a method of manufacturing a semiconductor device according to this invention.

An ion implantation (first isolation step) is carried out for a laminate which is formed by depositing a semiconductor layer (active layer) on a semi-insulating substrate. Consequently, a predetermined region is changed into an insulator, as indicated by crosses in FIG. 1A. The region includes a region on which a contact pad will be formed. As a result, a conducting path which extends from the left side to the right side is left on the laminate. Although only a single subcell is illustrated in FIG. 1A, subcells practically exist in both neighbors. In this case, these subcells are in an electrical contact via the conducting path.

Subsequently, the etching is precisely performed for the laminate, and the contact pad is formed on the laminate. In this event, the etching uniformity is improved as compared to the conventional case because each cell is electrically connected with the adjacent subcell, as mentioned above. Further, a parasitic capacitance can be restrained, since a region on which the contact pad will be formed is changed into the insulator.

Figure 1B:
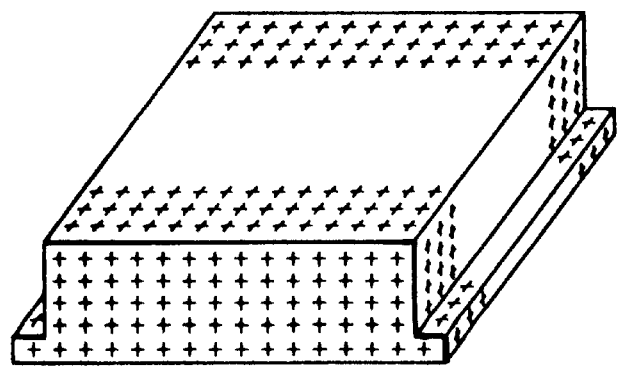

Finally, the etching is carried out so as to reach the semi-insulating substrate, as shown in FIG. 1B. Consequently, the conducting path between the subcell and the adjacent subcell is disrupted. Thus, a complete isolation (second isolation step) is performed between the devices.

(First embodiment)

Referring to FIGS. 2 to 6, description will be made about a manufacturing method according to a first embodiment of this invention. The first embodiment is applied to expose a base layer and a collector layer of a subcell of an emitter-up power heterojunction bipolar transistor (HBT).

First, formation of an active layer and a first isolation step are carried out as follows.

An n+-GaAs collector contact layer 2 of 300 nm thickness having silicon concentration of $3 \times 10^{18} cm^{-3}$, and an n-GaAs collector layer 3 of 500 nm thickness having silicon concentration of $3 \times 10^{16} cm^{-3}$, a P+-GaAs base layer 4 of 100 nm thickness having carbon (C) concentration of $2 \times 10^{19} cm^{-3}$, an n-$In_{0.49}Ga_{0.51}P$ emitter layer 5 of 20 nm thickness having silicon concentration of $3 \times 10^{17} cm^{-3}$, and an n+-GaAs emitter contact layer 6 of 100 nm thickness having silicon concentration of $3 \times 10^{18} cm^{-3}$ are sequentially deposited by the known metal organic vapor phase deposition (MOCVD) on a semi-insulating gallium arsenide (GaAs) substrate 1.

A photoresist layer 7 of 1 $\mu$m thickness is formed and patterned to expose a predetermined region (the emitter contact layer 6) of the semiconductor. Next, ion implantation is carried out for the exposed region for isolation, using oxygen of an energy of 80 KeV and a sheet density of $2 \times 10^{14} cm^{-2}$, hydrogen (H) of the energy of 40 KeV and the sheet density of $8 \times 10^{15} cm^{-2}$, and H of the energy of at 130 KeV and the sheet density of $8 \times 10^{15} cm^{-2}$. The ion implanted region is represented by crosses ("+") in FIG. 2. The ion implanted region is changed into an insulator. Thereafter, the photoresist layer 7 is removed.

Figure 2:
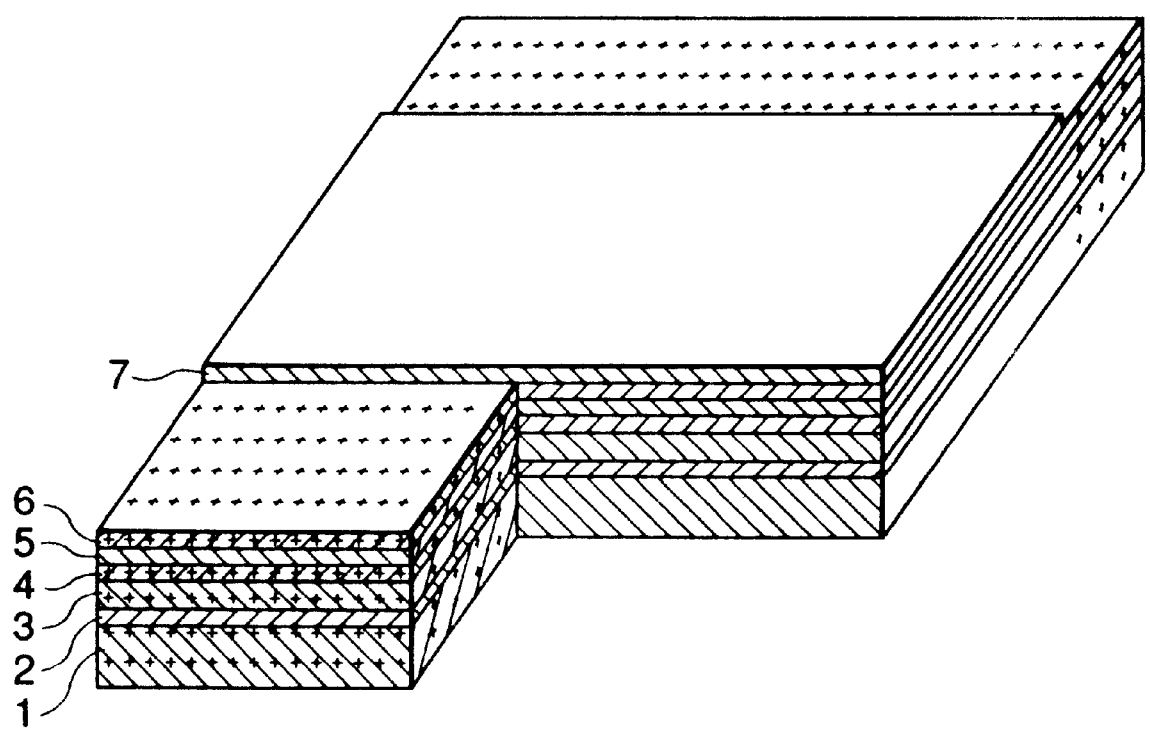
FIGS. 2, 3, 4, 5A, 5B, 6A and 6B show a method of manufacturing an emitter-up power heterojunction bipolar transistor cell according to a first embodiment of this invention.

In FIG. 2, a region in which no ions are implanted extends from the left side to the right side in the figure. The region comprises a conducting path. The illustrated subcell is electrically connected with the adjacent subcell (not shown) via the conducting path.

Figure 3:
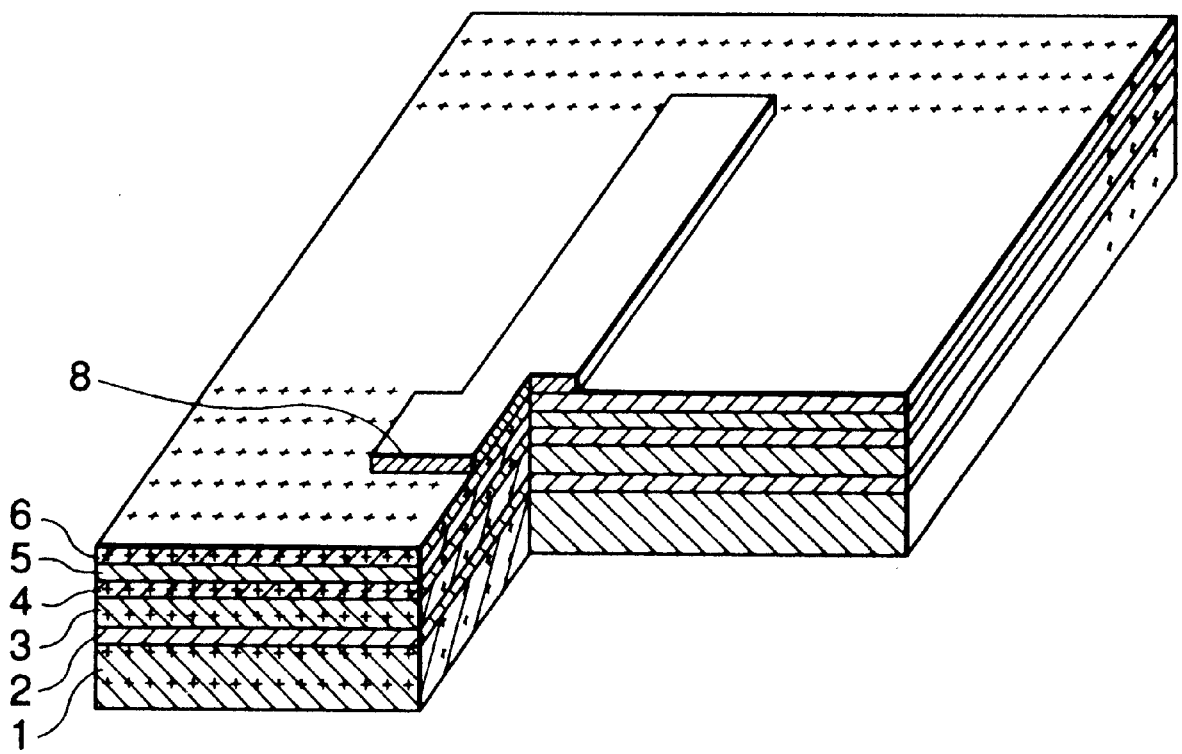

Second, an emitter contact metal 8 consisting of gold-germanium alloy ($Au_{0.88}Ge_{0.12}$) of 70 nm thickness, nickel (Ni) of 20 nm thickness, Au of 200 nm thickness is formed by photolithography using a photoresist of 1 $\mu$m thickness, and evaporation and liftoff process, as shown in FIG. 3.

Figure 4:
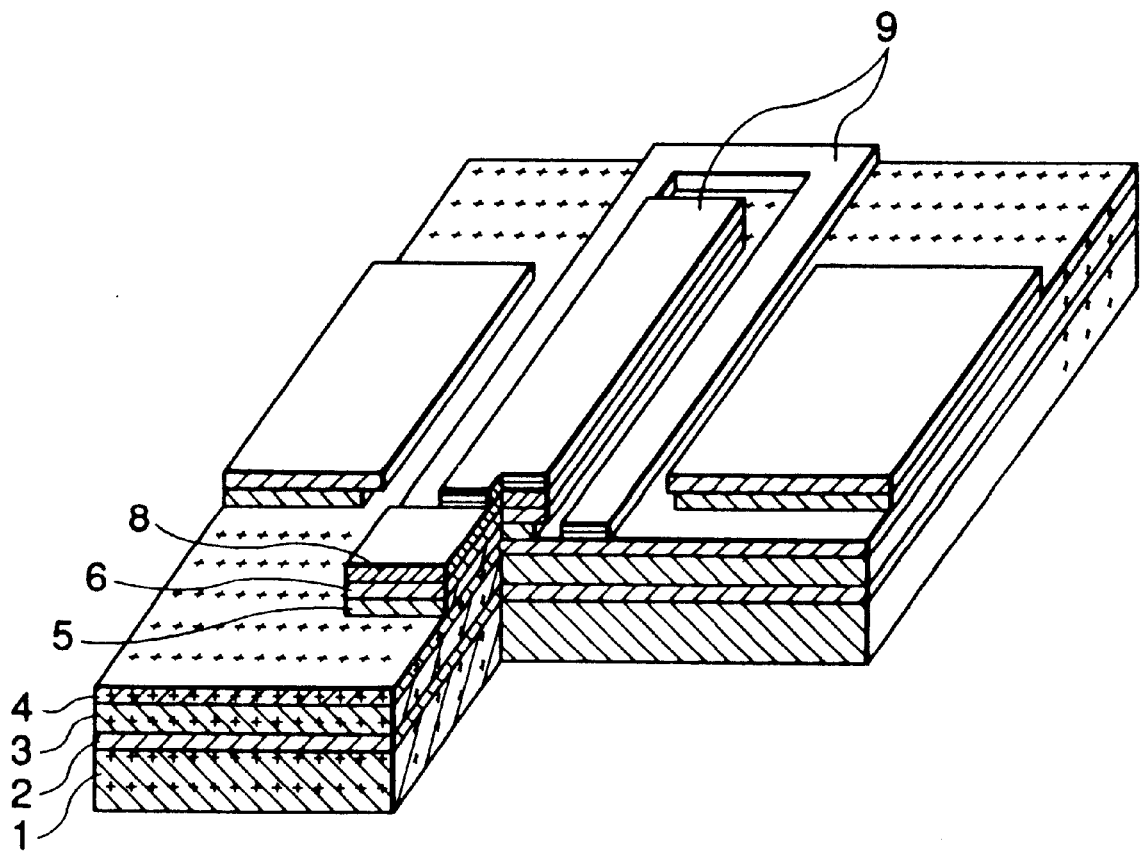

Third, a base contact is formed as follows. As shown in FIG. 4, the base layer 4 is exposed by sequentially removing the emitter contact layer 6 and the emitter layer 5 by etching, using the emitter contact metal 8 to mask the emitter area and a photoresist of 1 $\mu$m thickness to mask the conducting path, respectively. In this case, the emitter contact layer 6 is etched in sulfuric acid ($H_2SO_4$):hydrogen peroxide ($H_2O_2$):water ($H_2O$)=1:8:1000, while the emitter layer 5 is etched in hydrochloric acid (HCl):phosphoric acid ($H_3PO_4$):$H_2O$=1:1:1. The photoresist is then removed. Thereafter, a base contact metal 9 consisting of platinum (Pt) of 50 nm thickness and gold (Au) of 200 nm thickness is formed by the known photolithograhy using a photoresist of 1 $\mu$m thickness, evaporation and liftoff process, as shown in FIG. 4.

Figure 5A:
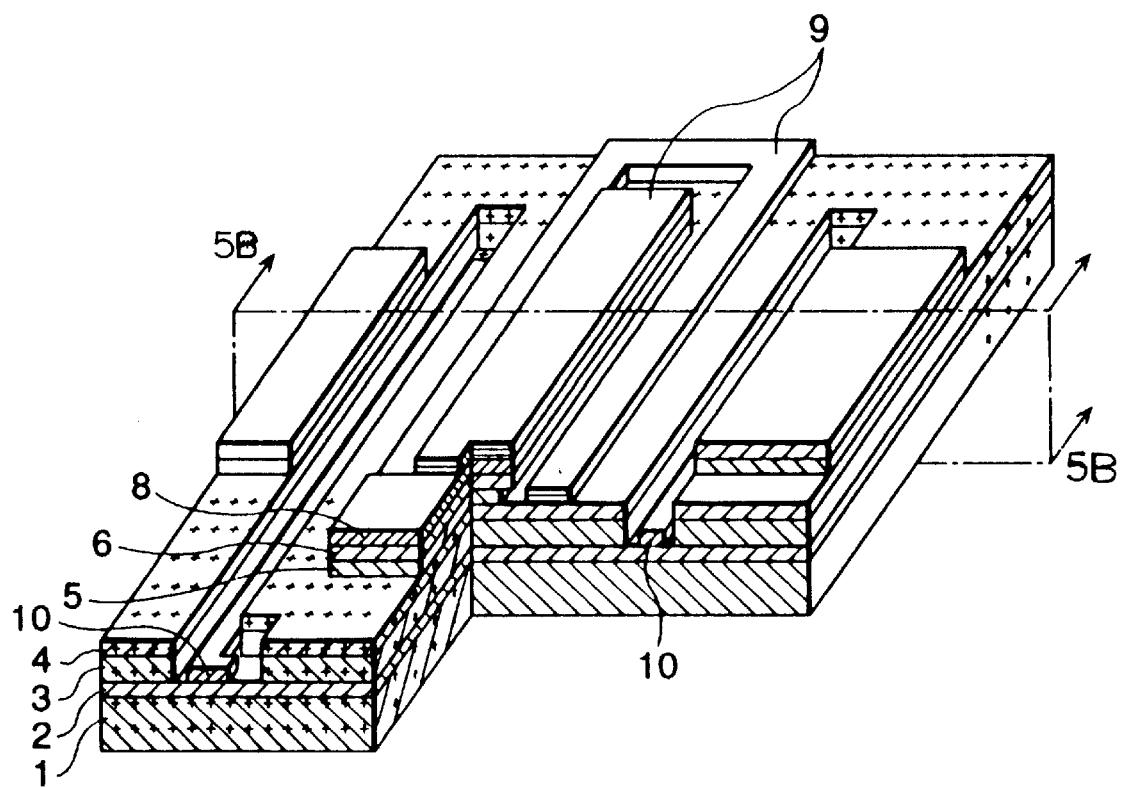
Figure 5B:
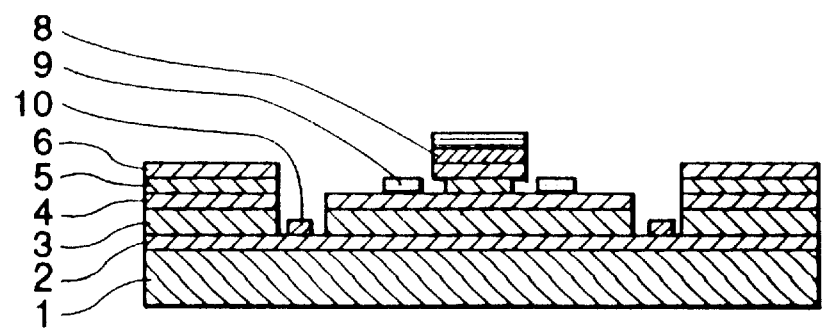

Fourth, the collector contact is formed as follows. The collector contact layer 2 is exposed by removing the base layer 4 and the collector layer 3 by etching in $H_2SO_4$:$H_2O_2$=1:8:1000, using a photoresist of 1 $\mu$m thickness which exposes only the collector contact region as a mask. Next, a collector contact metal 10 consisting of $Au_{0.88}Ge_{0.12}$ of 70 nm thickness, Ni of 20 nm thickness and Au of 200 nm thickness is formed by the known evaporation and liftoff process using the above photoresist mask, as shown in FIGS. 5A and 5B. The photoresist mask is then removed.

Figure 6A:
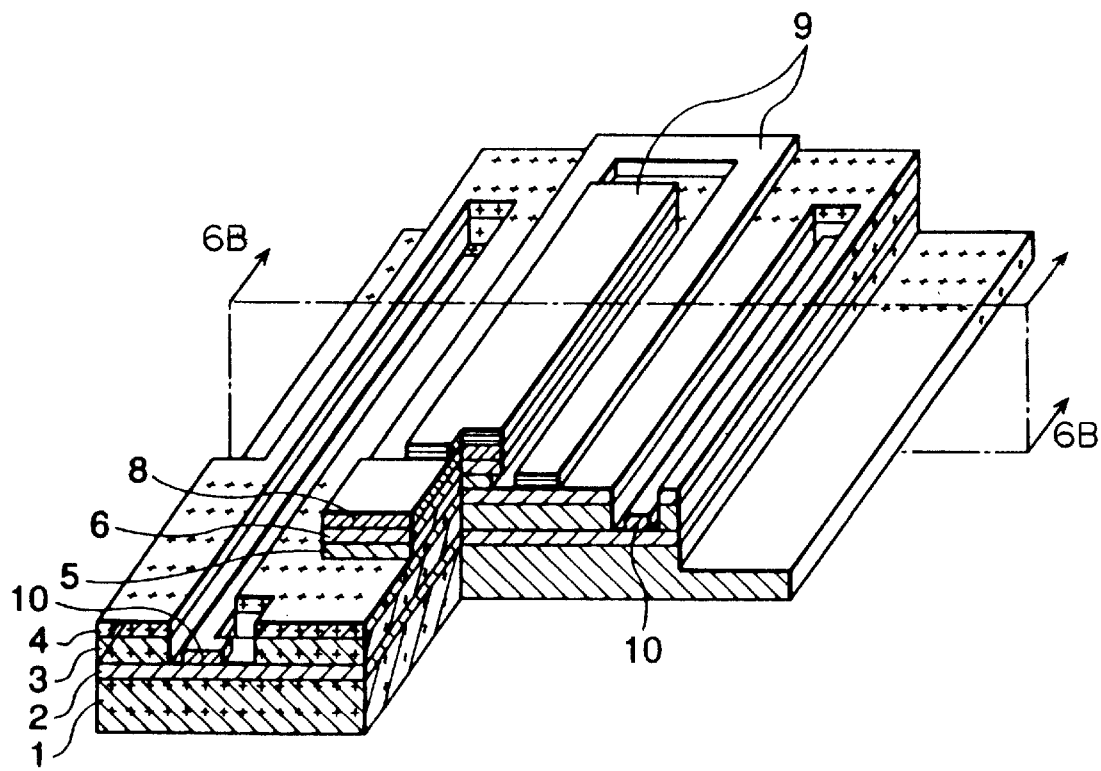
Figure 6B:
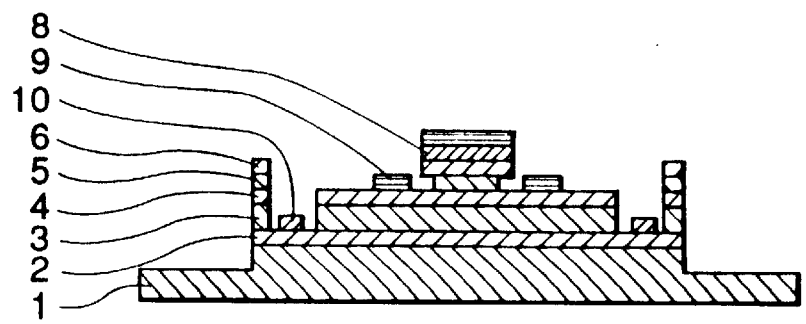

Fifth, the conducting path is disrupted by removing the emitter contact layer 6, the emitter layer 5, the base layer 4, the collector layer 4 and the collector contact layer 2 by etching, using a photoresist of 1 $\mu$m thickness to mask the subcell, as shown in FIGS. 6A and 6B. The GaAs substrate 1 is etched to a depth of 20 nm. In this case, the emitter contact layer 6 is etched in $H_2SO_4$:$H_2O_2$:$H_2O$=1:8:1000, while the emitter layer 5 is etched in HCl:$H_3PO_4$:$H_2O$=1:1:1. Further, the base layer 4, the collector layer 4, the collector contact layer 2 and the GaAs substrate 1 are etched in $H_2SO_4$:$H_2O_2$:$H_2O$=1:8:1000. The photoresist is then removed.

Finally, the ohmic contacts are alloyed at 400° C. in nitrogen atmosphere by the use of a hot plate. Further, interconnects between the subcells are formed follows. An insulating film consisting of a silicon oxide (SiOx) of 1 $\mu$m thickness is formed by the known plasma enhanced chemical vapor deposition (PECVD) at 300° C. A photoresist of 1 $\mu$m thickness is patterned by the known photolithography to form through holes on the ohmic metal film of the insulating film. The through holes are formed in the insulating film SiOx by plasma etching in Freon ($CF_4$). The photoresist mask is then removed. Thereafter, a path metal film consisting of titanium of 10 nm thickness and Pt of 40 nm thickness is formed by the known sputtering method. In addition, the interconnects are patterned by photolithography with a photoresist of 1.5 $\mu$m thickness to form gold of 1.0 $\mu$m thickness by electroplating. The photoresist is then removed. Subsequently, the path metal film outside the interconnects are etched by the known ion milling method using Argon at an energy of 500eV.

The HBT with emitter area of $5 \times 20$ $\mu m^2$ which is fabricated as mentioned above has a current gain of 50, a unity current gain cutoff frequency of 22 GHz and a maximum oscillation frequency of 28 GHz.

Further, the yield of a wafer over diameter of 3 inch becomes 65%, as compared to 55% for the conventional method (a method in which the complete device-to-device isolation is carried out before etching the emitter mesa to expose the base layer), since the uniformity of the base etching is improved.

Although an npn bipolar transistor is described in the first embodiment, this invention may also be applied to a pnp bipolar transistor. The pnp structure may achieved using the above structure by changing the material of the emitter layer 5 to $Al_xGa_{1-x}As$ (x=about 0.3) and by changing the doping as follows. Namely, C of $1 \times 10^{20} cm^{-3}$, C of $5 \times 10^{16} cm^{-3}$, Si of $3 \times 10^{18} cm^{-3}$, C of $1 \times 10^{17} cm^{-3}$ and C of $1 \times 10^{20} cm^{-3}$ are doped into the collector contact layer 2, the collector layer 3, the base layer 4, the emitter layer 5 and the emitter contact layer 6, respectively.

In addition, substitution of various materials is possible according to this invention. For example, an InP may be used instead of the GaAs substrate 1, while an InGaAs may be used instead of the GaAs collector contact 2, the collector layer 3 and the base layer 4. Further, an AlGaAs, an InAlAs or an InP may be used instead of the InGaP emitter 5.

Moreover, this invention may also be applied to a hot electron transistors which has a structure of semi-insulating GaAs substrate/n-GaAs collector contact/ i-AlGaAs collector barrier/n-GaAs base/i-AlGaAs emitter barrier/n-GaAs emitter contact.

Although the device-to-device isolation is carried out by two insulating steps in the above first embodiment, the isolation may be performed by three or more insulating steps. Further, the ion implantation is carried out as the first isolation step and the etching step is performed as the second isolation step in the first embodiment. However, the etching step may be substituted for the first isolation step and the implantation may be substituted for the second isolation step.

(Second embodiment)

Referring to FIGS. 7 to 11, description will be made about a manufacturing method according to a second embodiment of this invention. The second embodiment is applied to expose a base layer and a collector layer of a subcell of an collector-up power heterojunction bipolar transistor (HBT).

First, formation of an active layer and a first isolation step are carried out as follows.

An n$^+$-GaAs emitter contact layer 22 of 400 nm thickness having silicon concentration of $3 \times 10^{18}$cm$^{-3}$, an n-In$_{0.49}$Ga$_{0.51}$P emitter layer 23 of 500 nm thickness having silicon concentration of $3 \times 10^{16}$cm$^{-3}$, a P$^+$-GaAs base layer 24 of 100 nm thickness having carbon (C) concentration of $2 \times 10^{19}$cm$^{-3}$, an n-GaAs collector layer 25 of 20 nm thickness having silicon concentration of $3 \times 10^{17}$cm$^{-3}$ and an n-GaAs collector contact layer 26 of 100 nm thickness having silicon concentration of $3 \times 10^{18}$cm$^{-3}$ are sequentially deposited by the known metal organic vapor phase deposition (MOCVD) on a semi-insulating gallium arsenide (GaAs) substrate 21.

A photoresist layer 27 of is formed and patterned to expose a predetermined region (the collector contact layer 26) of the semiconductor. Next, ion implantation is carried out for the exposed region for isolation, using oxygen of an energy of 80 KeV and a sheet density of $2 \times 10^{14}$cm$^{-2}$, hydrogen (H) of the energy of 40 KeV and the sheet density of $8 \times 10^{15}$cm$^{-2}$, and H of the energy of at 130 KeV and the sheet density of $8 \times 10^{15}$cm$^{-2}$. The ion implanted region is represented by crosses ("+") in FIG. 7. The ion implanted region is changed into an insulator. Thereafter, the photoresist layer 27 is removed.

Figure 7:
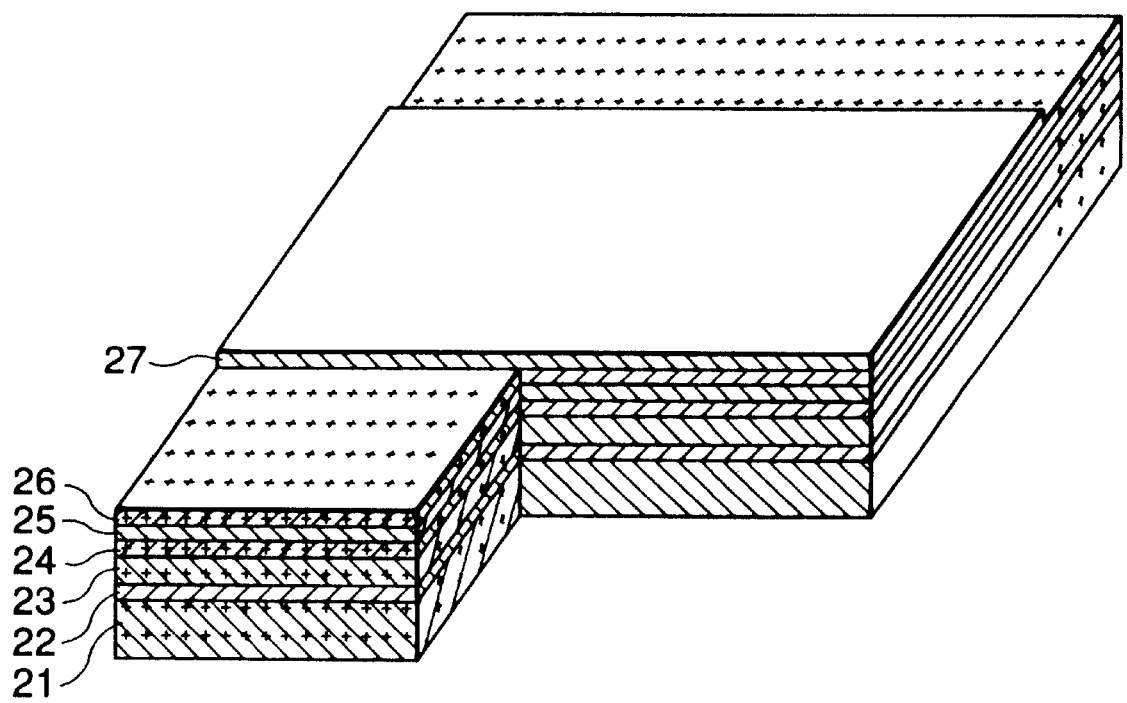
FIGS. 7, 8, 9, 10A, 10B, 11A and 11B show a method of manufacturing a collector-up power heterojunction bipolar transistor cell according to a second embodiment of this invention.

In FIG. 7, a region in which no ions are implanted extends from the left side to the right side in FIG. 7. The region comprises a conducting path. The illustrated subcell is electrically connected with the adjacent subcell (not shown) via the conducting path.

Figure 8:
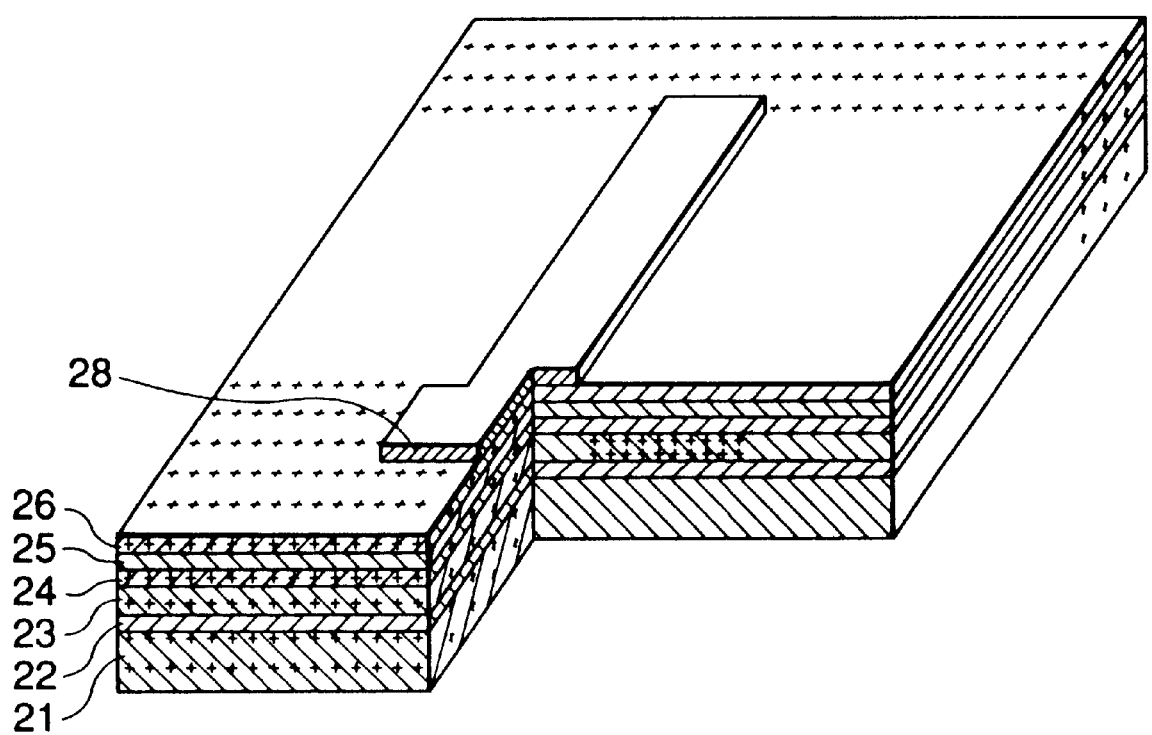

Second, a collector contact metal 28 consisting of gold-germanium alloy (Au$_{0.88}$Ge$_{0.12}$) of 70 nm thickness, nickel (Ni) of 20 nm thickness, Au of 200 nm thickness is formed by photolithography using a photoresist of 1 μm thickness, evaporation and liftoff process, as shown in FIG. 8. The emitter layer 23 under the extrinsic base layer 24 is converted to an insulator by implanting Oxygen (O) of $5 \times 10^{14}$cm$^{-2}$ at 250 KeV, using the collector contact metal film 28 and the photoresist as masks. The region in which the oxygen is implanted is represented by asterisks in FIG. 8.

Figure 9:
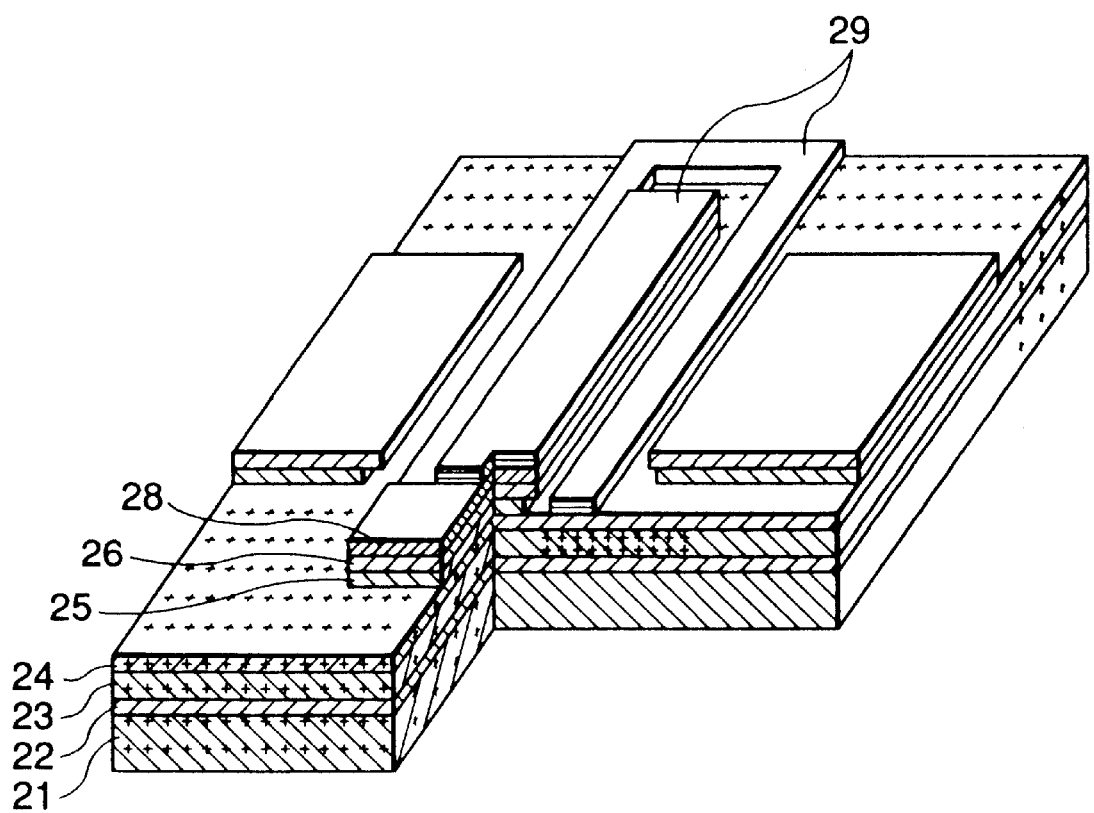

Third, a base contact is formed as follows. The base layer 24 is exposed by sequentially removing the collector contact layer 26 and the collector layer 25 by etching, using the collector contact metal 28 to mask the collector area and a photoresist of 1 μm thickness to mask the conducting path, respectively. In this case, the collector contact layer 26 and the collector layer 25 are etched in (H$_2$SO$_4$):(H$_2$O$_4$):(H$_2$O)= 1:8:1000. The photoresist is then removed. Thereafter, a base contact metal 29 consisting of platinum (Pt) of 50 nm thickness and gold (Au) of 200 nm thickness is formed by the known photolithograhy using a photoresist of 1 μm thickness, evaporation and liftoff process, as shown in FIG. 9.

Figure 10A:
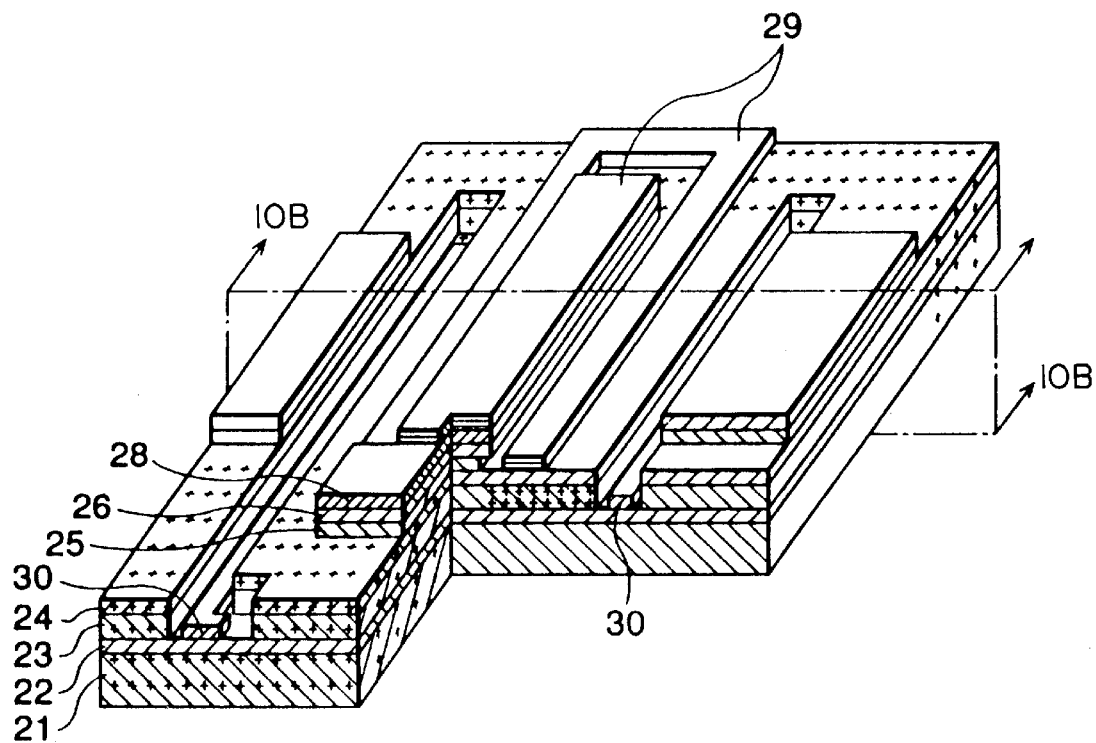
Figure 10B:
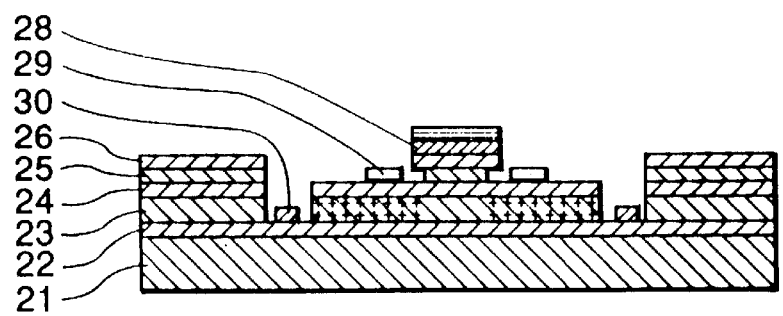
Figure 11A:
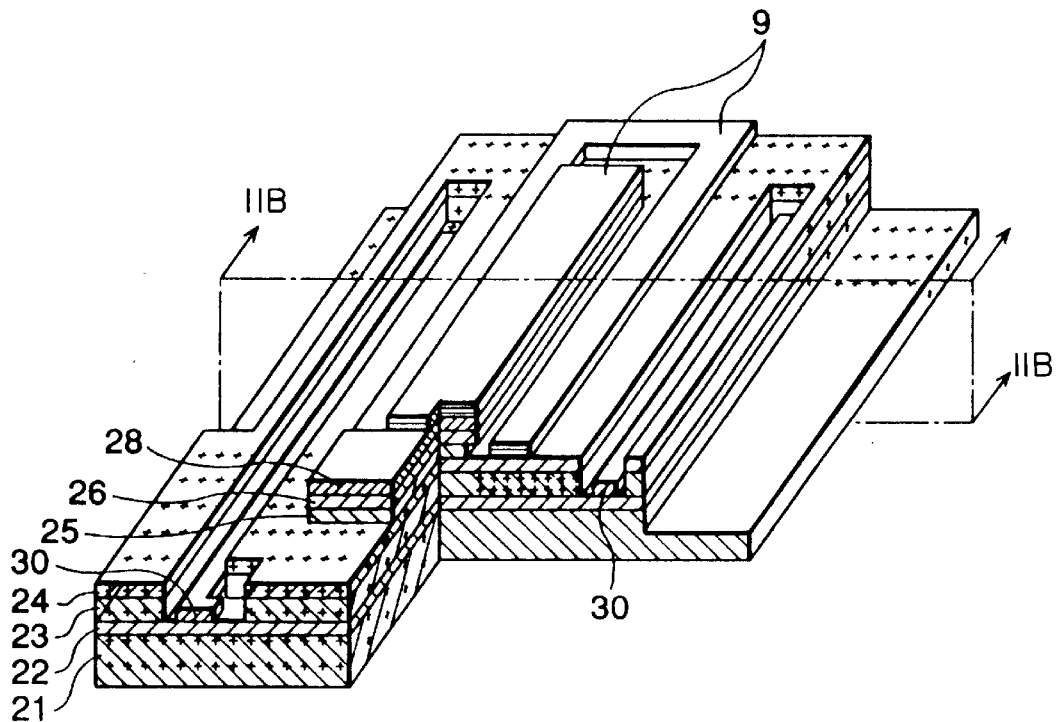
Figure 11B:
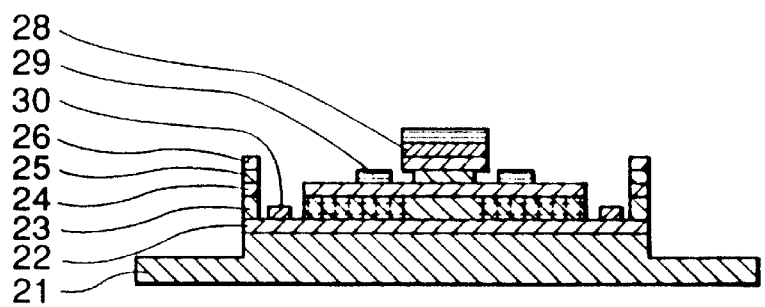

Fourth, the emitter contact is formed as follows. The emitter contact layer 22 is exposed by removing the base layer 24 and the emitter layer 23, using a photoresist of 1 μm thickness which exposes only the emitter contact layer 22 as a mask. In this case, the base layer 24 is etched in H$_2$SO$_4$:H$_2$O$_4$:H$_2$O=1:8:1000, while the emitter layer 23 is etched in HCl:H$_3$PO$_4$:H$_2$O=1:1:1. Next, a emitter contact metal 30 consisting of Au$_{0.88}$Ge$_{0.12}$ of 70 nm thickness, Ni of 20 nm thickness and Au of 200 nm thickness is formed by the known evaporation and liftoff process using the above photoresist mask, as shown in FIGS. 10A and 10B. The photoresist mask is then removed.

Fifth, the conducting path is disrupted by removing the collector contact layer 26, the collector layer 25, the base layer 24, the emitter layer 23 and the emitter contact layer 22 by etching, using a photoresist of 1 μm thickness to mask the subcell. The GaAs substrate 21 is etched to a depth of 20 nm. In this case, the emitter layer 23 is etched in HCl:H$_3$PO$_4$:H$_2$O=1:1:1, while the base layer 24, the collector layer 25, the collector contact layer 26, the emitter contact layer 22 and the GaAs substrate 21 are etched in H$_2$SO$_4$:H$_2$O$_4$:H$_2$O=1:8:1000. The photoresist is then removed.

Finally, the ohmic contacts are alloyed at 400° C. in nitrogen atmosphere by the use of a hot plate. Further, interconnects between the subcells are formed follows. An insulating film consisting of a silicon oxide (SiOx) of 1 μm thickness is formed by the known plasma enhanced chemical vapor deposition (PECVD) at 300° C. A photoresist of 1 μm thickness is patterned by the known photolithography to form through holes on the ohmic metal film of the insulating film. The through holes are formed in the insulating film SiOx by plasma etching in Freon (CF$_4$). The photoresist mask is then removed. Thereafter, a path metal film consisting of titanium of 10 nm thickness and Pt of 40 nm thickness is formed by the known sputtering method. In addition, the interconnects are patterned by the known photolithography with a photoresist of 1.5 μm thickness to form gold of 1.0 μm thickness by electroplating. The photoresist is then removed. Subsequently, the path metal film outside the interconnects are etched by the known ion milling method using Argon at an energy of 500eV.

The HBT with emitter area of 5×20 μm$^2$ which is fabricated as mentioned above has a current gain of 10, a unity current gain cutoff frequency of 18 GHz and a maximum oscillation frequency of 32 GHz.

Further, the yield of a wafer over diameter of 3 inch becomes 60%, as compared to 45% for the conventional method (a method in which the complete device-to-device isolation is carried out before etching the emitter mesa to expose the base layer), since the uniformity of the base etching is improved.

Although an npn bipolar transistor is described in this embodiment, the this invention may also be applied to a pnp bipolar transistor. The pnp structure may achieved using the above structure by changing the material of the emitter layer 23 to Al$_x$Ga$_{1-x}$As (x=about 0.3) and by changing the doping as follows. Namely, C of $1 \times 10^{20}$cm$^{-3}$, C of $5 \times 10^{16}$cm$^{-3}$, Si of $3 \times 10^{18}$cm$^{-3}$, C of $1 \times 10^{17}$cm$^{-3}$ and C of $1 \times 10^{20}$cm$^{-3}$ are doped into the collector contact layer 26, the collector layer 25, the base layer 24, the emitter layer 23 and the emitter contact layer 22, respectively.

In addition, substitution of various materials is possible according to this invention. For example, an InP may be used instead of the GaAs substrate 21, while an InGaAs may be used instead of the GaAs collector contact layer 26, the collector layer 25 and the base layer 24. Further, an AlGaAs, an InAlAs or an InP may be used instead of the InGaP emitter layer 23.

Moreover, this invention may also be applied to a hot electron transistors which has a structure of semi-insulating GaAs substrate/n-GaAs emitter contact/i-AlGaAs emitter barrier/n-GaAs base/i-AlGaAs collector barrier/ n-GaAs collector contact.

Although the device-to-device isolation is carried out by two insulating steps in the above second embodiment, the isolation may be performed by three or more insulating steps. Further, the ion implantation is carried out as the first isolation step and the etching step is performed as the second isolation step in the first embodiment. However, the etching step may be substituted for the first isolation step and the implantation may be substituted for the second isolation step.

(Third embodiment)

Referring to FIGS. 12 to 16, description will be made about a manufacturing method according to a third embodiment of this invention. The third embodiment is applied to expose a base layer and a collector layer of a subcell of an emitter-up power heterojunction bipolar transistor (HBT), in particular, to etch a collector under an extrinsic base layer to reduce parasitic capacitance.

First, formation of an active layer and a first isolation step are carried out as follows.

An n$^+$-GaAs collector contact layer 32 of 300 nm thickness having silicon concentration of $3 \times 10^{18}$cm$^{-3}$, an n-In$_{0.49}$Ga$_{0.51}$P collector layer 33 of 500 nm thickness having silicon concentration of $3 \times 10^{16}$cm$^{-3}$, a P$^+$-GaAs base layer 34 of 100 nm thickness having carbon (C) concentration of $2 \times 10^{19}$cm$^{-3}$, an n-In$_{0.49}$Ga$_{0.51}$P emitter layer 35 of 20 nm thickness having silicon concentration of $3 \times 10^{17}$cm$^{-3}$, and an n$^+$-GaAs emitter contact layer 36 of 100 nm thickness having silicon concentration of $3 \times 10^{18}$cm$^{-3}$ are sequentially deposited by the known metal organic vapor phase deposition (MOCVD) on a semi-insulating gallium arsenide (GaAs) substrate 31. In addition, the n-In$_{0.49}$Ga$_{0.51}$P collector layer 33 has two Si doped planes 33$a$, 33$b$ of concentration $1 \times 10^{12}$cm$^{-2}$ which are positioned 7 nm apart from the interface of the collector contact layer 32 and 7 nm apart from the interface of the base layer 34, as shown in FIG. 12.

A photoresist layer 37 is formed and patterned to expose a predetermined region (the emitter contact layer 36) of the semiconductor. Next, ion implantation is carried out for the exposed region for isolation, using oxygen of an energy of 80 KeV and a sheet density of $2 \times 10^{14}$cm$^{-2}$, hydrogen (H) of the energy of 40 KeV and the sheet density of $8 \times 10^{15}$cm$^{-2}$, and H of the energy of at 130 KeV and the sheet density of $8 \times 10^{15}$cm$^{-2}$. The ion implanted region is represented by crosses ("+") in FIG. 12. The ion implanted region is changed into an insulator. Thereafter, the photoresist layer 37 is removed.

Figure 12:
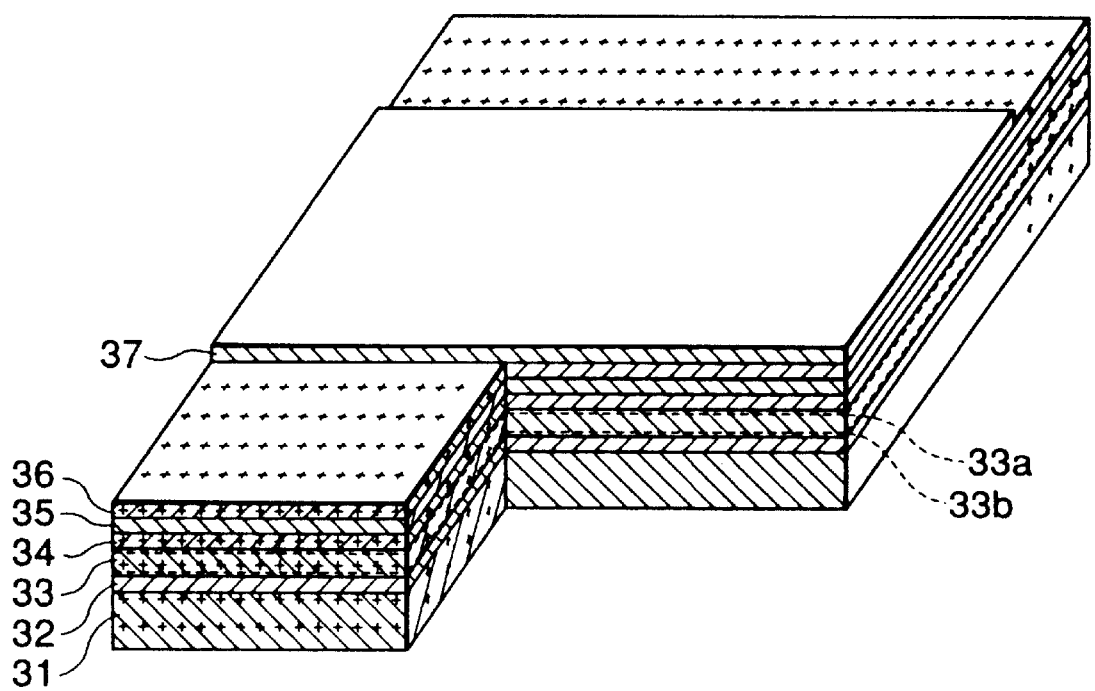
FIGS. 12, 13, 14, 15A, 15B, 16A and 16B show a method of manufacturing an emitter-up power heterojunction bipolar transistor cell according to a third embodiment of this invention.

In FIG. 12, a region in which no ions are implanted extends from the left side to the right side in FIG. 12. The region comprises a conducting path. The illustrated subcell is electrically connected with the adjacent subcell (not shown) via the conducting path.

Figure 13:
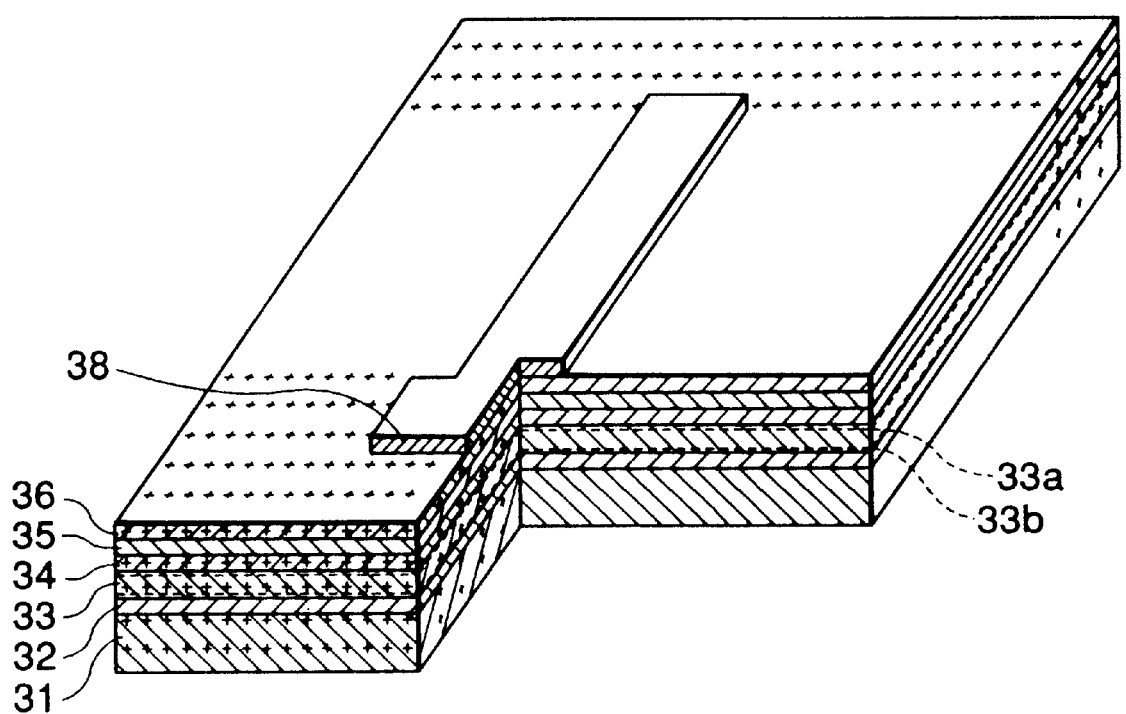

Second, an emitter contact metal 38 consisting of gold-germanium alloy (Au$_{0.88}$Ge$_{0.12}$) of 70 nm thickness, nickel (Ni) of 20 nm thickness, Au of 200 nm thickness is formed by the known photolithography using a photoresist of 1 $\mu$m thickness, evaporation and liftoff process, as shown in FIG. 13.

Figure 14:
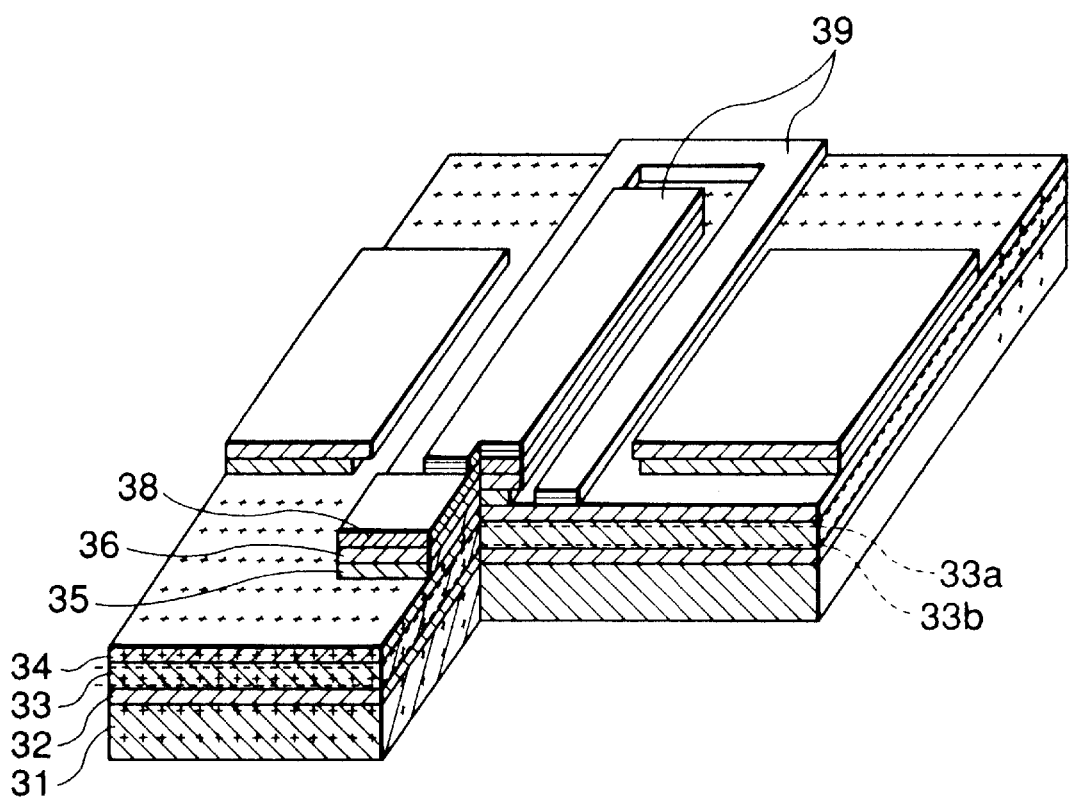

Third, a base contact is formed as follows. The base layer 34 is exposed by sequentially removing the emitter contact layer 36 and the emitter layer 35 by etching, using the emitter contact metal layer 38 to mask the emitter area and a photoresist of 1 $\mu$m thickness to mask the conducting path, respectively. In this case, the emitter contact layer 36 is etched in H$_2$SO$_4$:H$_2$O$_4$:H$_2$O =1:8:1000, while the emitter layer 35 is etched HCl:H$_3$PO$_4$:H$_2$O=1:1:1. The photoresist is then removed. Thereafter, a base contact metal 39 consisting of Pt of 50 nm thickness and Au of 200 nm thickness is formed by the known photolithograhy using a photoresist of 1 $\mu$m thickness, evaporation and liftoff process, as shown in FIG. 14.

Figure 15A:
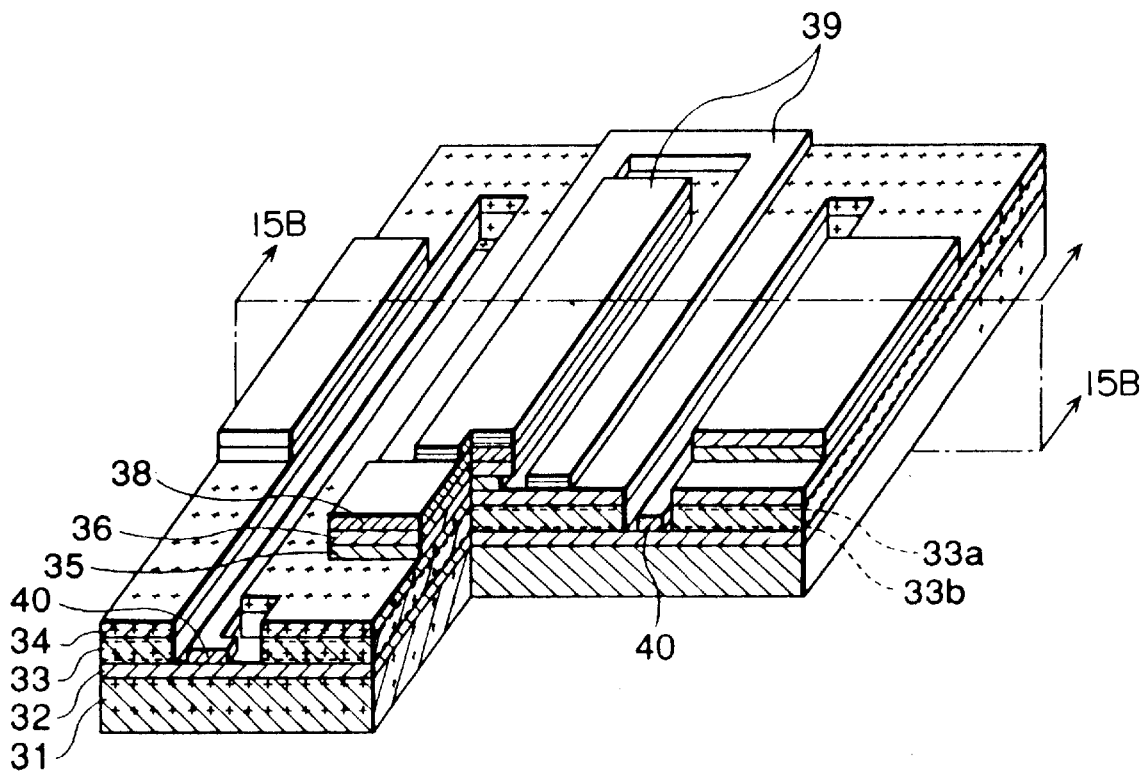
Figure 15B:
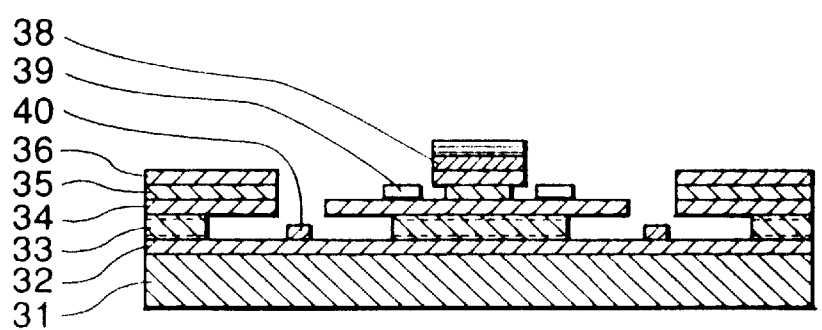
Figure 16A:
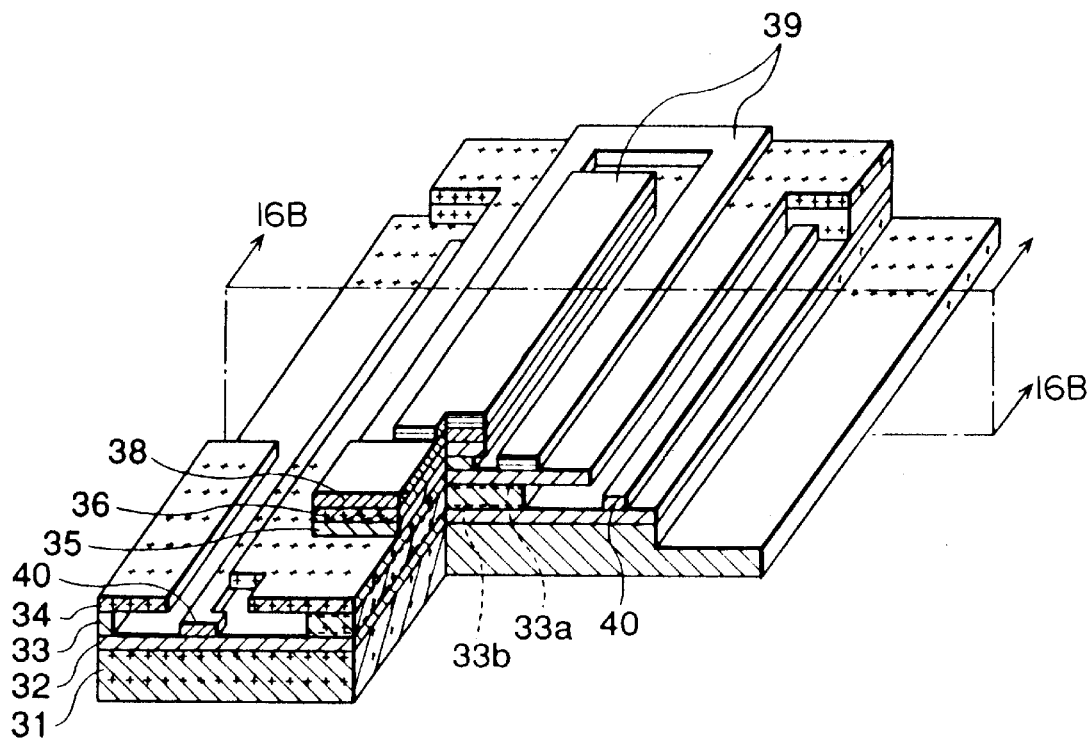
Figure 16B:
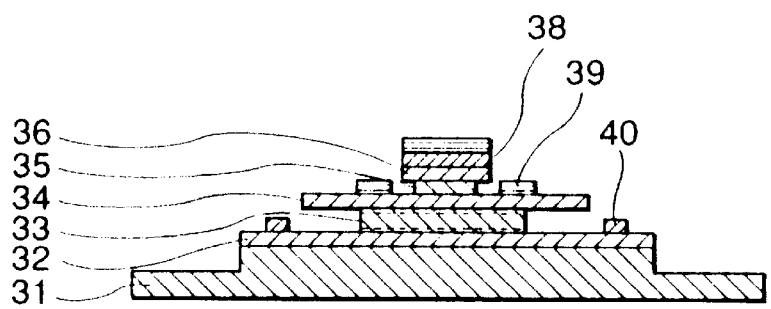

Fourth, the collector contact is formed as follows. The collector contact layer 32 is exposed by removing the base layer 34 and the collector layer 33 by etching, using a photoresist of 1 $\mu$m thickness which exposes only the collector contact layer 32 as a mask. In this case, the base layer 34 is etched in H$_2$SO$_4$:H$_2$O$_4$:H$_2$O=1:8:1000, while the collector layer 33 is etched in HCl:H$_3$PO$_4$:H$_2$O=1:1:1. The etching of the collector layer 33 stops on the collector contact layer 32 because of selectivity of the etching. In this event, the etching duration is increased to achieve a lateral undercut under the extrinsic base layer 34. This step reduces parasitic capacitance. Next, a collector contact metal 40 consisting of Au$_{0.88}$Ge$_{0.12}$ of 70 nm thickness, Ni of 20 nm thickness and Au of 200 nm thickness is formed by the known evaporation and liftoff process using the above photoresist mask, as shown in FIG. 15A and 15B. The photoresist mask is then removed.

Fifth, the device-to-device isolation is realized by disrupting the above conducting path. The conducting path is disrupted by removing the emitter contact layer 36, the emitter layer 35, the base layer 34, the collector layer 33 and the collector contact layer 32 by etching, using a photoresist of 1 $\mu$m thickness to mask the subcell. The GaAs substrate 31 is etched to a depth of 20 nm. In this case, the GaAs is etched in H$_2$SO$_4$:H$_2$O$_4$:H$_2$O=1:8:1000, while the InGaAs is etched in HCl:H$_3$PO$_4$:H$_2$O=1:1:1. The photoresist is then removed.

Finally, an ohmic contact is alloyed at 400° C. in nitrogen atmosphere by the use of a hot plate. Further, interconnects between the subcells are formed follows. An insulating film consisting of a silicon oxide (SiOx) of 1 $\mu$m thickness is formed by the known plasma enhanced chemical vapor deposition (PECVD) at 300° C. A photoresist of 1 $\mu$m thickness is patterned by the known photolithography to form through holes on the ohmic metal film of the insulating film. The through holes are formed in the insulating film SiOx by plasma etching in Freon (CF$_4$). The photoresist mask is then removed. Thereafter, a path metal film consisting of titanium of 10 nm thickness and Pt of 40 nm thickness is formed by the known sputtering method. In addition, the interconnects are patterned by photolithography with a photoresist of 1.5 $\mu$m thickness to form gold of 1.0 $\mu$m thickness by electroplating. The photoresist is then removed. Subsequently, the path metal film outside the interconnects are etched by the known ion milling method using Argon at an energy of 500eV.

The HBT with emitter area of 5×20 $\mu$m$^2$ which is fabricated as mentioned above has a current gain of 40, a unity current gain cutoff frequency of 19 GHz and a maximum oscillation frequency of 24 GHz.

Further, the yield of a wafer over diameter of 3 inch becomes 55%, as compared to 40% for the conventional method (a method in which the complete device-to-device isolation is carried out before etching the emitter mesa to expose the base layer), since the etching uniformity in exposing the base layer and undercutting the extrinsic base layer is improved.

Although an npn bipolar transistor is described in this embodiment, this invention may also be applied to a pnp bipolar transistor. The pnp structure may achieved using the above structure by changing the materials of the emitter layer 35 and the collector layer 33 to Al$_x$Ga$_{1-x}$As (x=about 0.3) and by changing the doping as follows. Namely, C of $1\times10_{19}cm^{-3}$, C of $1\times10^{16}cm^{-3}$, Si of $3\times10^{18}cm^{-3}$, C of $1\times10^{17}cm^{-3}$ and C of $1\times1019cm^{-3}$C of $1\times10_{12}cm^{-3}$ are doped the collector contact layer 32, the collector layer 33, the base layer 34, the emitter layer 35, the emitter contact layer 36 and the doped plane 33a, 33b, respectively.

In addition, substitution of various materials is possible according to this invention. For example, an InP may be used instead of the GaAs substrate 31, while an AlGaAs, InAlAs or InP may be used instead of the GaAs collector contact layer 32 and the collector layer 33. Further, an InGaAs may be used instead of the GaAs base layer 34, while AlGaAs, an InAlAs or an InP may be used instead of the InGaP emitter 35.

Although the device-to-device isolation is carried out by two insulating steps in the above third embodiment, the isolation may be performed by three or more insulating steps. Further, the ion implantation is carried out as the first isolation step and the etching step is performed as the second isolation step in the first embodiment. However, the etching step may be substituted for the first isolation step and the implantation may be substituted for the second isolation step.

(Fourth embodiment)

Referring to FIGS. 17 to 23, description will be made about a fourth embodiment of this invention. The fourth embodiment may be used to fabricate a maximum circuit for fuzzy logic application whose design and function are explained in Hung and Lui, Electronics Letters, Vol. 30 (1994), p. 1924. The output current 42 is equal to the maximum of input current 41 in the maximum circuit illustrated in FIG. 17.

Figure 17:
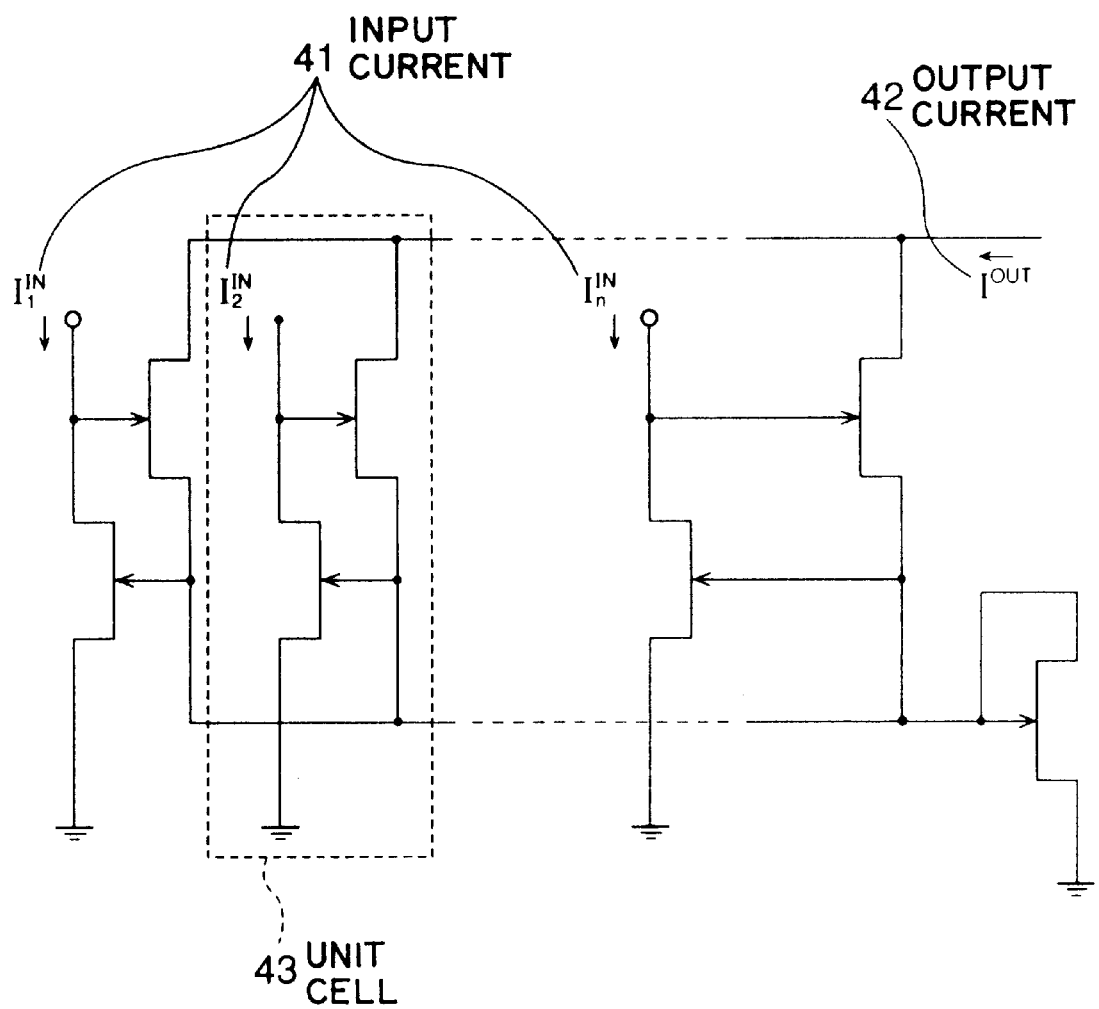
FIG. 17 shows a circuit structure of a maximum circuit related to a fourth embodiment of this embodiment.
Figure 18:
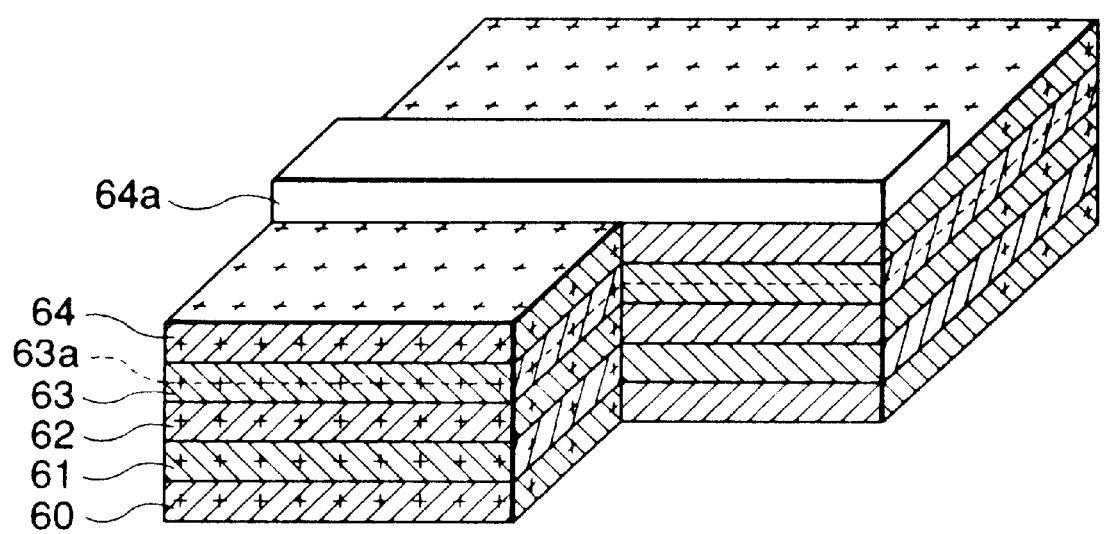
FIGS. 18, 19, 20A, 20B, 21A, 21B, 22A, 22B, 23A and 23B show a method of manufacturing an unit cell (field effect transistor) of the maximum circuit in FIG. 17 according to a fourth embodiment of this invention.
Figure 19:
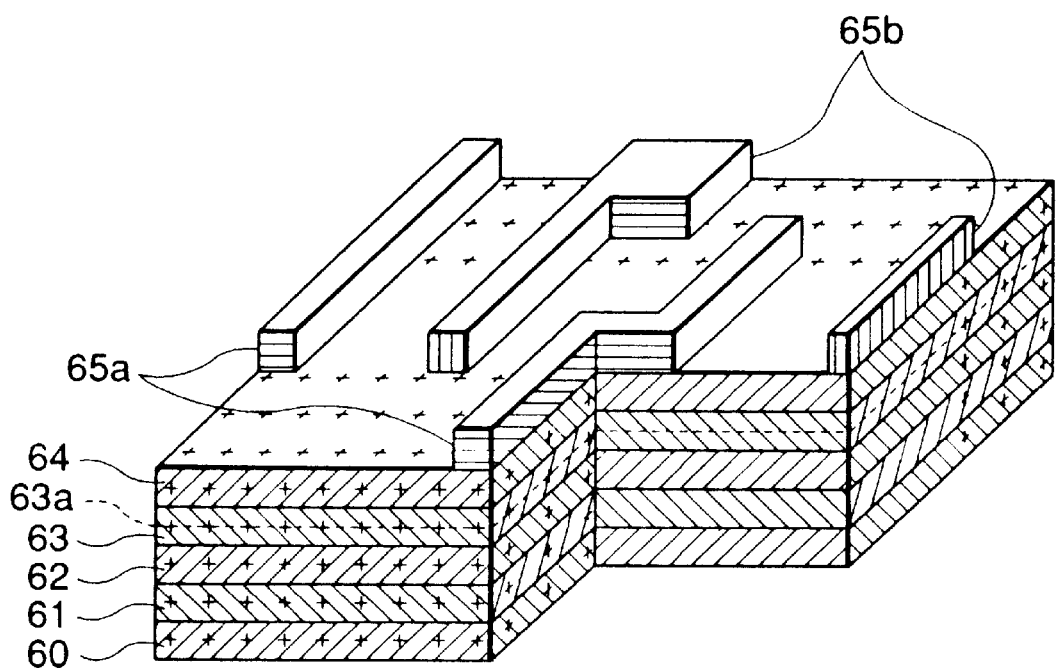

Referring to FIGS. 18 to 20, description will be made about a method of fabricating a unit cell 43 constituting the above maximum circuit in FIG. 17.

First, an $i-Al_{0.25}Ga_{0.75}As$ buffer layer 61 of 5 nm thickness, an $i-In_{0.20}Ga_{0.80}As$ channel layer 62 of 10 nm thickness, an $i-Al_{0.20}Ga_{0.80}As$ carrier supply layer 63 of 30 nm thickness and an N-GaAs contact layer 64 of 60 nm thickness with Si concentration of $3\times10^8cm^{-3}$ are sequentially formed using the known molecular beam epitaxy (MBE) on a semi-insulating gallium arsenide (GaAs) substrate 60. In this case, the carrier supply layer 63 of 30 nm has a Si doping plane 63a of concentration of $1\times10^{12}cm^{-2}$ which is located 1.5 nm apart from the interface of the channel layer 62. A photoresist layer 64a of 1 μm thickness is formed to expose a predetermined region (the collector layer 64) of the semiconductor. Ions are implanted into the exposed region for isolation with oxygen at an energy of 80 KeV and sheet density of $2\times10^{14}cm^{-2}$, as shown in FIG. 18. In FIG. 18, the ion-implanted region is represented by crosses in FIG. 18. The photoresist layer 64a is then removed. Thus, the region in which no ions are implanted extends from the left side to the right side in FIG. 18. The region comprises a conducting path. The illustrated subcell is connected with the adjacent subcell (not shown) via the conducting path.

Second, source and drain contact metals 65a, 65b consisting of gold-germanium alloy $(Au_{0.88}Ge_{0.12})$ of 70 nm thickness, nickel (Ni) of 20 nm thickness, Au of 200 nm thickness are formed by the known photolithography, evaporation, and liftoff process, using a photoresist of 1 μm thickness, as shown in FIG. 19. The contact metals 65a, 65b are alloyed at 400° C. for 1 minute in a nitrogen atmosphere.

Figure 20A:
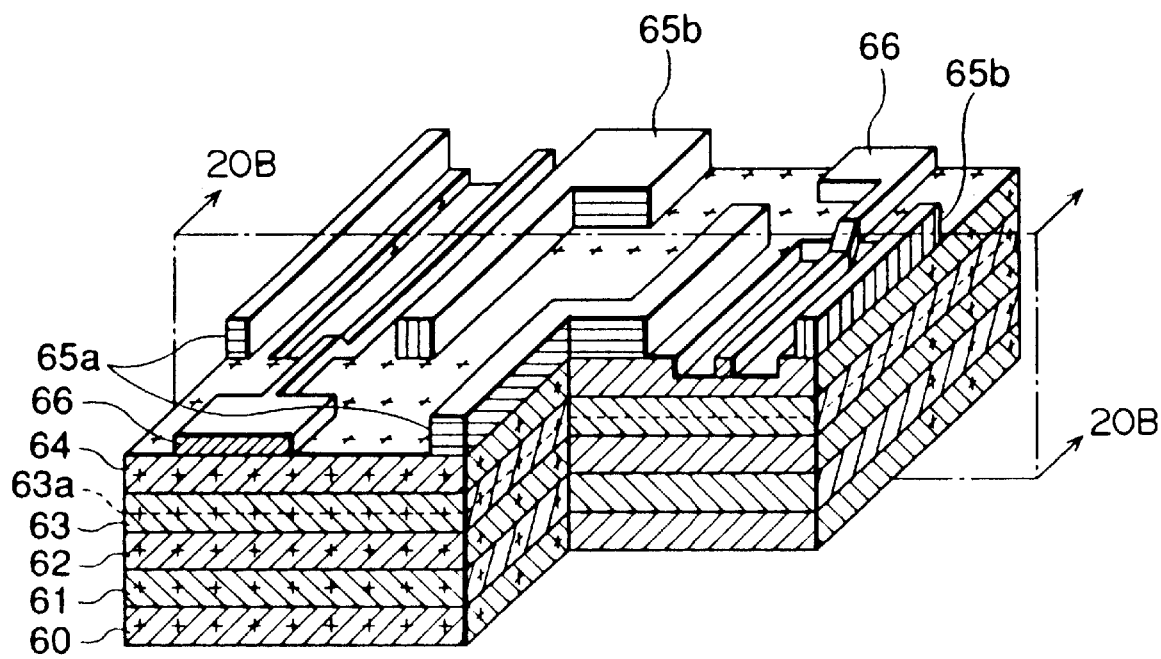
Figure 20B:
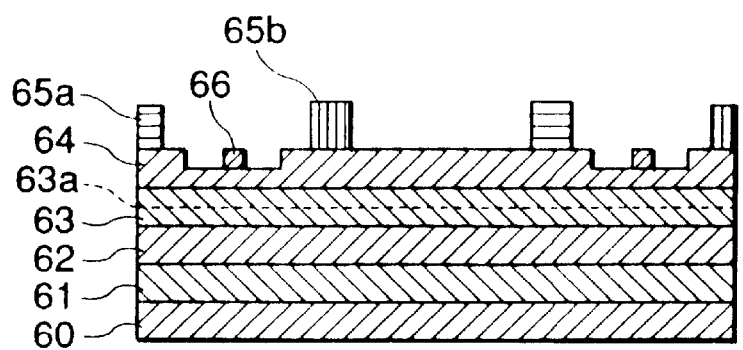

Third, the gate electrode is formed as follows. A photoresist is formed and patterned to form a gate recess (groove for the gate). The gate recess is patterned with the photoresist, the contact layer 64 is etched in $H_2SO_4:H_2O_2:H_2O=1:8:1000$, and the photoresist is then removed. Subsequently, the gate metals 66 are formed by patterning with a photoresist and by evaporation and liftoff, as shown in FIGS. 20A and 20B.

Figure 21A:
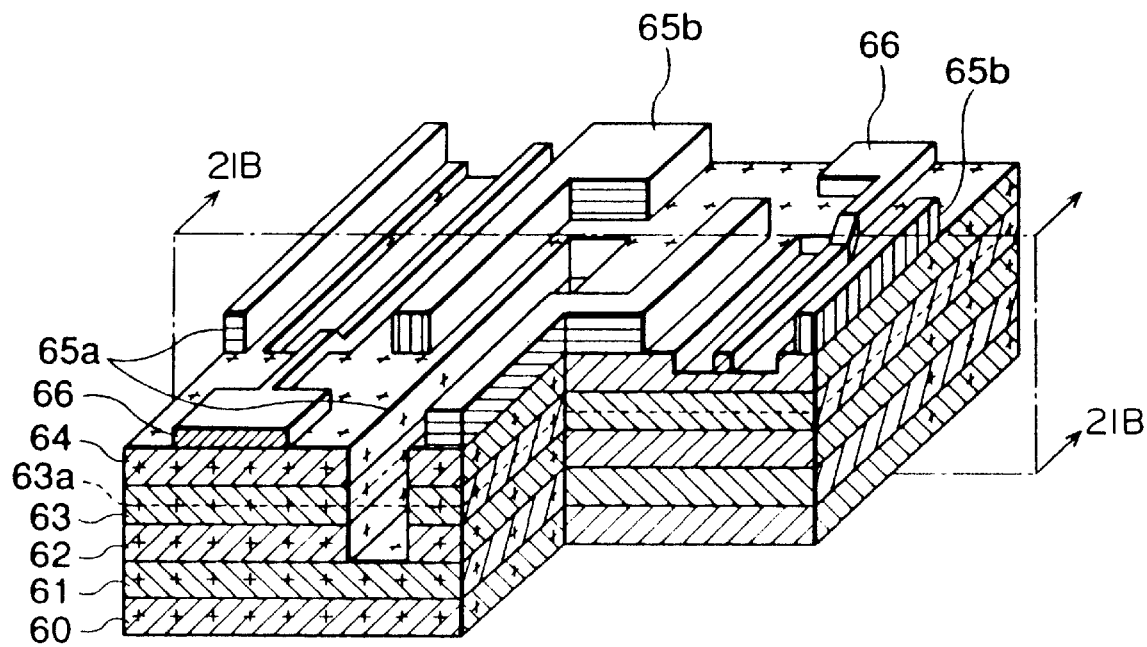
Figure 21B:
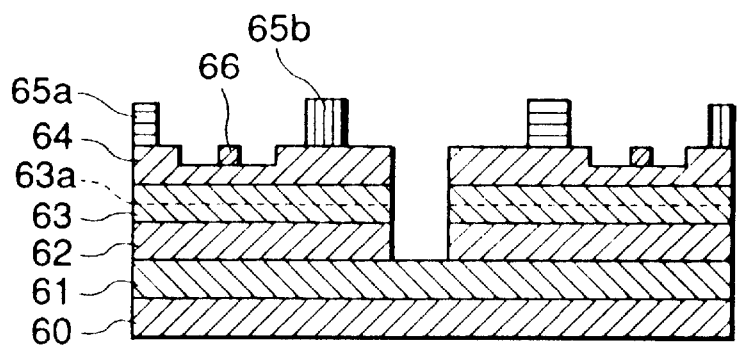

Fourth, the conducting path is disrupted by removing the contact layer 64, the carrier supply layer 63, and the channel layer 62 by etching in $H_2SO_4:H_2O_2:H_2O=1:8:1000$, using a photoresist of 1 μm thickness to mask the gate region and the source-drain contact region, as shown in FIGS. 21A and 21B. The photoresist is then removed.

Figure 22A:
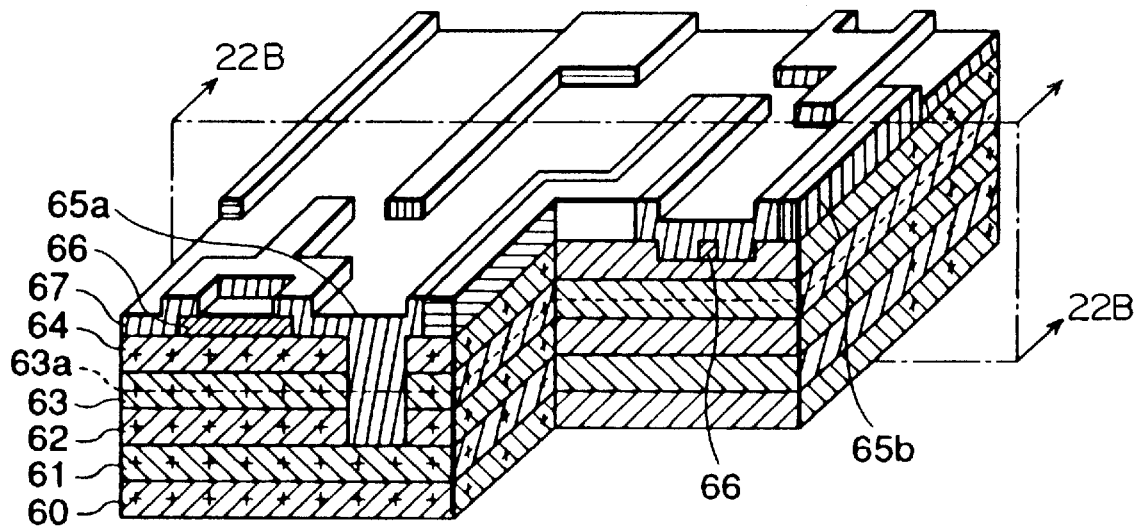
Figure 22B:
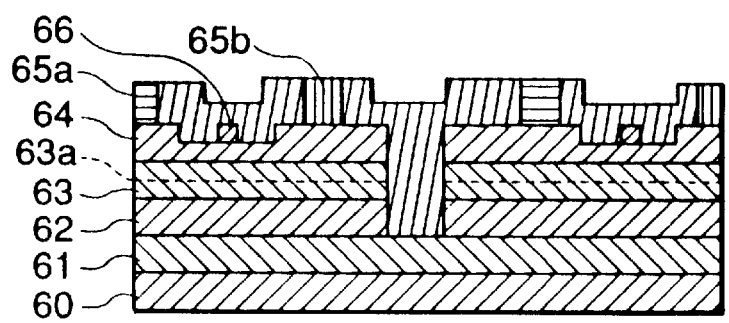
Figure 23A:
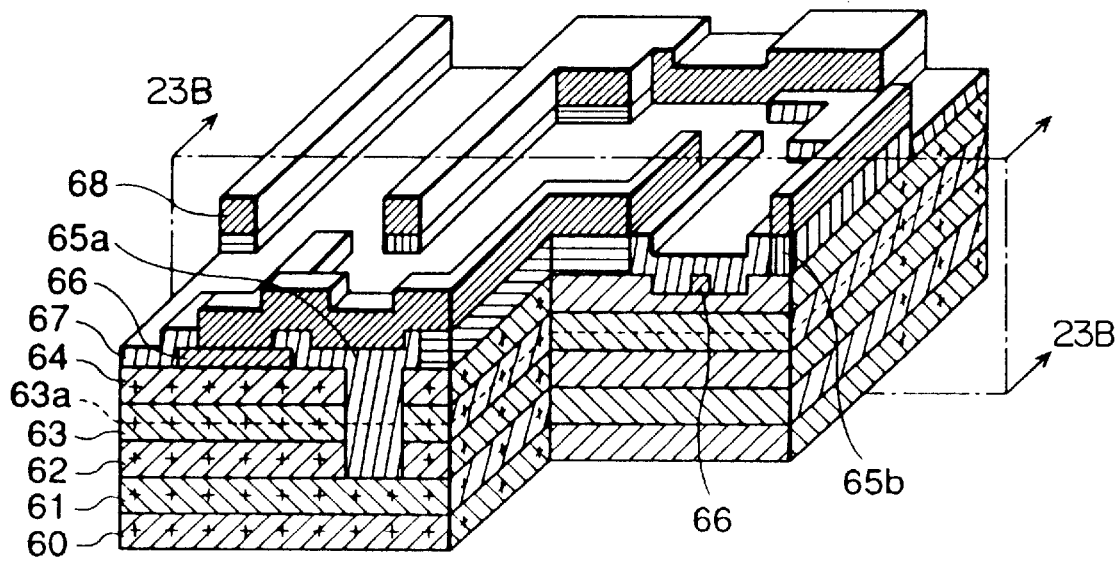
Figure 23B:
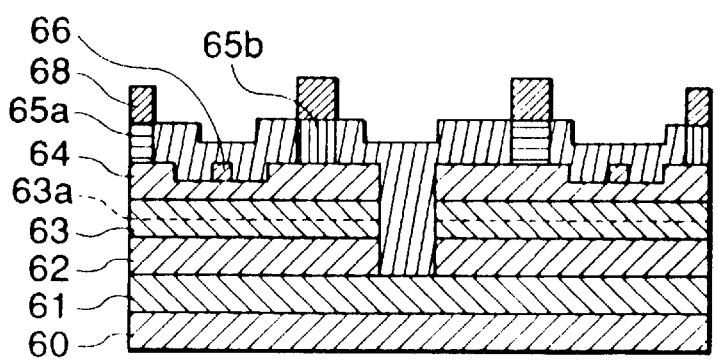

Fifth, a glassivation layer 67 is formed with SiNx of 20 nm thickness and SiOx of 1 μm thickness by the known PECV, as shown in FIGS. 22A and 22B. Next, the glassivation layer 67 is etched in buffered hydrofluoric acid to form through holes over the gate contact pads and the ohmic metals with a photoresist.

Finally, the unit cell circuit configuration in FIG. 17 is obtained by fabricating interconnects as follows. A path metal consisting of titanium of 10 nm thickness and Pt of 40 nm thickness is formed by the known sputtering method. Subsequently, the interconnects are patterned by the known photolithography with a photoresist of 1.5 μm thickness and formed by electroplating gold of 1.0 μm thickness. Thereafter, the photoresist is removed. Next, the portions of the path metals outside the interconnects are etched by ion milling in Argon at an energy of 500 eV.

The maximum circuit having three unit cells can be realized through the above mentioned process. The yield of the gate recess etch according to this invention is 65% or more on a wafer having diameter of 2 inch diameter, as compared to 50% in the conventional case.

Although the maximum circuit is described in the fourth embodiment, this invention is not restricted to the maximum circuit and can be applied to various circuit configurations.

In addition, the heterostructure junction field effect transistors (HJFET) is explained in the fourth embodiment. However, the invention can be applied to the other devices including an HBT and a metal-semiconductor field effect transistors (MESFET).

Further, the n-channel HJFET is used in the fourth embodiment, but a p-channel HJFET may be used instead of the n-channel HJFET with the above structure by changing the doping as follows. Namely, C of $1\times10^{19}cm^{-3}$ and C of $2\times10^{12}cm^{-2}$ are doped into the GaAs contact layer 64 and the doping plane 63a, respectively.

Moreover, various material substitutions are possible in this invention. For example, InP may be used instead of the GaAs substrate 60, while InAlAs may be used instead of the AlGaAs buffer layer 61. Further, InAlAs or InGaP may be used instead of the AlGaAs carrier supply layer 63, while InGaAs may be used instead of the GaAs contact layer 64.

Although the device-to-device isolation is carried out in two isolation steps according to the fourth embodiment, three or more isolation steps may be used instead.

Further, the ion implantation is used for the first isolation step and the etching is used for the second isolation step. Alternatively, the etching may be substituted for the first isolation step and the implantation may be substituted for the second isolation step.

What is claimed is:

1. A method of manufacturing a semiconductor device having a substrate, comprising the steps of:

forming a semiconductor layer on said substrate, said semiconductor layer having a device forming region where a semiconductor device is to be formed;

changing a region of the semiconductor layer except for the device forming region into a insulator so that a conducting path extends across the device forming region;

etching the device forming region on the condition that the conducting path is left; and disrupting the conducting path after the etching.

2. The method as claimed in claim 1, wherein:

said insulator is formed by implanting ions into the region.

3. The method as claimed in claim 1, wherein:

the disruption is performed by etching said semiconductor layer and said substrate at edges of the semiconductor device.

4. The method as claimed in claim 1, wherein:

a contact pad is formed on the insulator.

5. A method of manufacturing a semiconductor integrated circuit having a first semiconductor device including a first device forming region and a second semiconductor device including a second device forming region, comprising the steps of;

changing a region except for the first and second device forming regions into an insulator so that a conducting path is left between the first and second semiconductor devices to electrically connect the first semiconductor device with the second semiconductor device;

etching the first and second device forming regions on the condition that the conducting path is left between said first and second semiconductor devices and;

disrupting the conducting path to completely isolate the first semiconductor device from the second semiconductor device after the etching.

6. A method as claimed in claim 5, wherein:

the etching of the first device forming region is substantially identical with that of the second device forming region in quantity.

7. The method as claimed in claim 5, wherein:

said insulator is formed by implanting ions into the region.

8. The method as claimed in claim 5, wherein:

the disruption is performed by etching said first and second semiconductor devices at edges thereof.

9. The method as claimed in claim 5, wherein:

a contact pad is formed on the insulator.

10. A method of manufacturing emitter-up bipolar transistor cells on a semi-insulating substrate, comprising the steps of:

sequentially forming a collector contact layer, a collector layer, a base layer, an emitter layer and an emitter contact layer on the substrate where the cells are to be formed;

changing a region of the emitter contact layer into an insulator so that a conducting path extends across where the cells are to be formed;

forming an emitter contact metal layer on the emitter contact layer;

etching the emitter contact layer and the emitter layer to expose the base layer;

forming a base contact metal layer on the exposed base layer;

etching the base layer and the collector layer to expose the collector contact layer;

forming a collector contact metal layer on the exposed collector contact layer; and disrupting the conducting path;

both etching steps being performed on the condition that the conducting path is left.

11. The method as claimed in claim 10, wherein:

said insulator is formed by implanting ions into the region.

12. The method as claimed in claim 10, wherein:

the disruption is performed by sequentially etching the emitter contact layer, the emitter layer, the base layer, the collector layer, the collector contact layer and the substrate.

13. The method as claimed in claim 10, wherein:

said semi-insulating substrate is one selected from a GaAs substrate and an InP substrate.

14. A method of manufacturing collector-up bipolar transistor cells on a semi-insulating substrate, comprising the steps of:

sequentially forming an emitter contact layer, an emitter layer, a base layer, a collector layer and a collector contact layer on the substrate where the cells are to be formed;

changing a region of the collector contact layer into an insulator so that a conducting path extends across where the cells are to be formed;

forming a collector contact metal layer on the collector contact layer;

etching the collector contact layer and the collector layer to expose the base layer;

forming a base contact metal layer on the exposed base layer;

etching the base layer and the emitter layer to expose the emitter contact layer;

forming an emitter contact metal layer on the exposed emitter contact layer; and disrupting the conducting path;

both etching steps being performed on the condition that the conducting path is left.

15. The method as claimed in claim 14, wherein:

said insulator is formed by implanting ions into the region.

16. The method as claimed in claim 14, wherein:

the disruption is performed by sequentially etching the collector contact layer, the collector layer, the base layer, the emitter layer, the emitter contact layer and the substrate.

17. The method as claimed in claim 14, wherein:

said semi-insulating substrate is one selected from a GaAs substrate and an InP substrate.

18. A method of manufacturing field effect transistor cells on a semi-insulating substrate, comprising the steps of:

sequentially forming a buffer layer, a channel layer, a carrier supply layer, a contact layer on the substrate where the cells are to be formed;

changing a region of the contact layer into an insulator so that a conducting path extends across where the cells are to be formed;

forming source and drain contact metal layers on the contact layer;

etching the contact layer to form a groove in the contact layer;

forming a gate metal layer in the groove; and disrupting the conducting path;

the etching step being performed on the condition that the conducting path is left.

19. The method as claimed in claim 18, wherein:

said insulator is formed by implanting ions into the region.

20. The method as claimed as claim 18, wherein:

the disruption is performed by sequentially etching the contact layer, the carrier supply layer and the channel layer.

21. The method as claimed in claim 18, wherein:

said semi-insulating substrate is one selected from a GaAs substrate and an InP substrate.

* * * * *